(12) United States Patent
Musashi

(10) Patent No.: US 11,043,610 B2
(45) Date of Patent: Jun. 22, 2021

(54) LIGHT-EMITTING DEVICE

(71) Applicant: NICHIA CORPORATION, Anan (JP)

(72) Inventor: Naoki Musashi, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/537,270

(22) Filed: Aug. 9, 2019

(65) Prior Publication Data

US 2020/0075802 A1    Mar. 5, 2020

(30) Foreign Application Priority Data

Aug. 30, 2018    (JP) .............................. JP2018-161092

(51) Int. Cl.
*H01L 33/08* (2010.01)
*H01L 51/42* (2006.01)

(52) U.S. Cl.
CPC .......... *H01L 33/08* (2013.01); *H01L 51/4206* (2013.01)

(58) Field of Classification Search
CPC ................. H01L 33/08; H01L 51/4206; H01L 33/50–508; H01L 2933/0041; H01L 27/15–156; H01L 2933/00–0091; H01L 51/50–56; H01L 51/0032–0095; H01L 27/32–3297; H01L 2251/50–568; H01L 25/0753; H01L 33/501; H01L 33/502
See application file for complete search history.

(56) References Cited

U.S. PATENT DOCUMENTS

| | | | |
|---|---|---|---|
| 2005/0067613 A1 | 3/2005 | Kim | |
| 2007/0126341 A1 | 6/2007 | Kawai | |
| 2008/0266861 A1 | 10/2008 | Justel et al. | |
| 2011/0127904 A1* | 6/2011 | Tsai | ........................ H01L 33/50 313/501 |
| 2013/0207002 A1 | 8/2013 | Greuel et al. | |
| 2013/0207151 A1 | 8/2013 | Eberhardt et al. | |
| 2013/0257264 A1 | 10/2013 | Tamaki et al. | |
| 2015/0211712 A1* | 7/2015 | Yoshimura | .............. H01S 5/005 362/84 |
| 2017/0111972 A1 | 4/2017 | Oepts et al. | |
| 2017/0186921 A1 | 6/2017 | Kim | |
| 2019/0097095 A1* | 3/2019 | Yamanaka | .......... H01S 5/02252 |

(Continued)

FOREIGN PATENT DOCUMENTS

| | | |
|---|---|---|
| JP | 2005-019359 A | 1/2005 |
| JP | 2005-109425 A | 4/2005 |
| JP | 2005-158551 A | 6/2005 |

(Continued)

OTHER PUBLICATIONS

Yoshida et al., "UV Phosphors for Highly Efficient Excitation by VUV", The Journal of the Institute of Image Information and Television Engineers, vol. 55, No. 4, Apr. 2001, pp. 566-570.

*Primary Examiner* — Shahed Ahmed
(74) *Attorney, Agent, or Firm* — Birch, Stewart, Kolasch & Birch, LLP

(57) ABSTRACT

A light-emitting device includes a light-emitting element which emits ultraviolet light, and a fluorescent layer provided on the light-emitting element. The fluorescent layer includes fluorescent particles. The fluorescent particles are excited by the ultraviolet light emitted by the light-emitting element and the excited fluorescent particles emit ultraviolet light of a wavelength longer than the ultraviolet light emitted by the light-emitting element.

14 Claims, 9 Drawing Sheets

(56) References Cited

U.S. PATENT DOCUMENTS

2019/0114974 A1* 4/2019 Chen ................. G02F 1/133514
2020/0251626 A1* 8/2020 Lee ........................ H01L 33/44

FOREIGN PATENT DOCUMENTS

| JP | 2009-519576 A | 5/2009 |
| JP | 2010-067927 A | 3/2010 |
| JP | 2013-216800 A | 10/2013 |
| JP | 2013-539238 A | 10/2013 |
| JP | 2013-229438 A | 11/2013 |
| JP | 2014-500890 A | 1/2014 |
| JP | 2017-523600 A | 8/2017 |

* cited by examiner

LIGHT-EMITTING DEVICE

CROSS-REFERENCE TO RELATED APPLICATION

This application claims priority to Japanese Patent Application No. 2018-161092, filed on Aug. 30, 2018, the disclosure of which is hereby incorporated by reference in its entirety.

BACKGROUND

The present invention relates to a light-emitting device.

Currently, a mercury UV lamp is known as a UV (ultraviolet) lamp having a structure in which a UV light-emitting fluorescent is coated onto a wall surface inside a tube in which mercury is sealed. Also, a UV lamp in which xenon gas is sealed has been proposed as a mercury-less UV lamp.

SUMMARY

The present invention provides a downsized light-emitting device emitting ultraviolet light.

In a mode of the present invention, a light-emitting device includes a light-emitting element which emits ultraviolet light, and a fluorescent layer provided on the light-emitting element. The fluorescent layer includes fluorescent particles. The fluorescent particles are excited by the ultraviolet light emitted by the light-emitting element and the excited fluorescent particles emit ultraviolet light of a wavelength longer than the ultraviolet light emitted by the light-emitting element.

The present invention can provide a downsized light-emitting device emitting ultraviolet light.

DETAILED DESCRIPTION OF EMBODIMENTS

Figure 1:
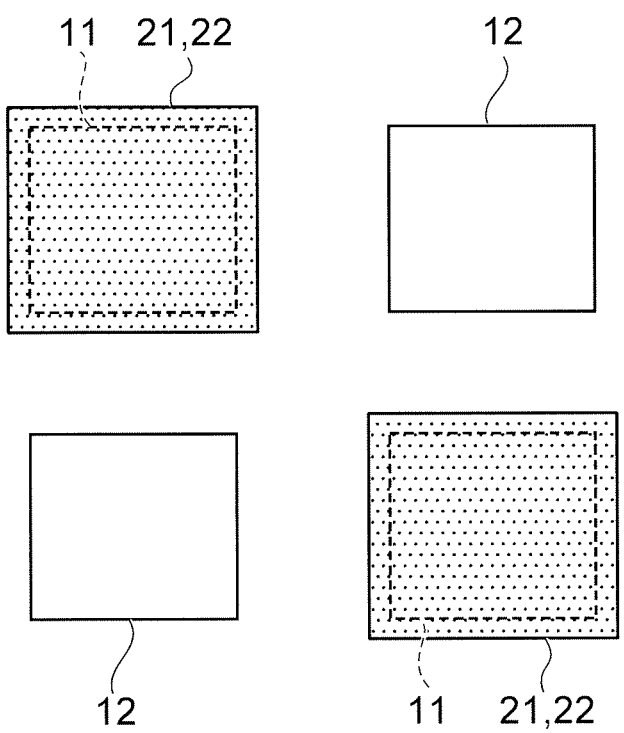
FIG. 1 is a schematic plan view showing a layout example of a first light-emitting element, a second light-emitting element, and a fluorescent layer in a light-emitting device of embodiments of the invention.

Embodiments will now be described with reference to the drawings. The same components in the drawings are marked with the same reference numerals.

An embodiment provides a light-emitting device in which a light-emitting element emitting ultraviolet light and a fluorescent layer emitting ultraviolet light are combined. The fluorescent layer is excited by the ultraviolet light emitted by the light-emitting element and emits ultraviolet light of a wavelength longer than the ultraviolet light emitted by the light-emitting element. In the specification, the ultraviolet light has peak wavelengths in the range not less than 245 nm and not more than 380 nm.

As shown in the schematic plan view of FIG. 1, the light-emitting device of the embodiment can include multiple first light-emitting elements 11 and multiple second light-emitting elements 12. Or, the light-emitting device of the embodiment can include one first light-emitting element 11 and one second light-emitting element 12. Or, the light-emitting device of the embodiment can include the first light-emitting element 11 and a fluorescent layer 21 (or 22) without including the second light-emitting element 12.

The fluorescent layer 21 (or 22) is provided on the first light-emitting element 11. A fluorescent layer is not provided on the second light-emitting element 12; and the second light-emitting element 12 is disposed in a region not including a fluorescent layer.

For example, the first light-emitting element 11 and the second light-emitting element 12 emit deep ultraviolet light having peak wavelengths in the range not less than 245 nm and not more than 305 nm. For example, the light emission wavelength of the first light-emitting element 11 and the light emission wavelength of the second light-emitting element 12 have peaks in the 280 nm vicinity or the 310 nm vicinity. The first light-emitting element 11 and the second light-emitting element 12 include, for example, light-emitting layers including aluminum gallium nitride.

The fluorescent layer 21 (or 22) includes fluorescent particles. The fluorescent particles include at least one of yttrium orthophosphate doped with cerium ($YPO_4$:Ce), yttrium oxide doped with gadolinium ($Y_2O_3$:Gd), or yttrium fluoride doped with gadolinium and praseodymium ($YF_3$: Gd, Pr).

For example, the light emission wavelength of $YPO_4$:Ce has a peak at the 330 nm vicinity or the 365 nm vicinity.

For example, the light emission wavelength of $Y_2O_3$:Gd has a peak at the 315 nm vicinity.

For example, the light emission wavelength of $YF_3$:Gd, Pr has a peak at the 311 nm vicinity.

First Embodiment

Figure 2A:
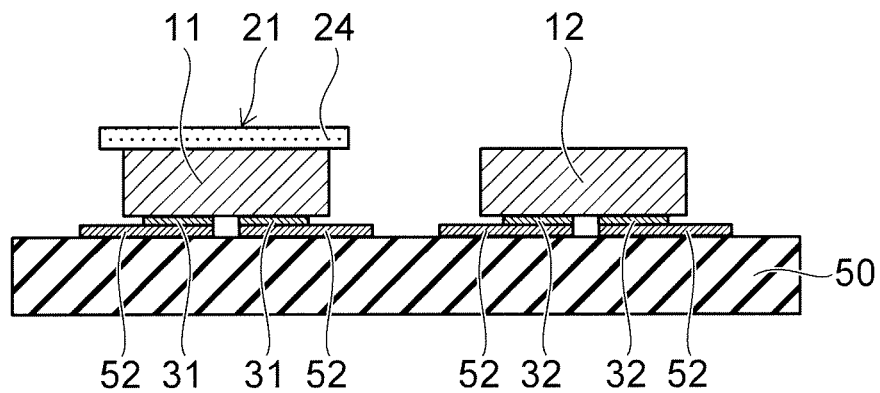
FIG. 2A is a schematic end view of a light-emitting device of a first embodiment of the invention.

FIG. 2A is a schematic end view of a light-emitting device of a first embodiment.

Figure 2B:
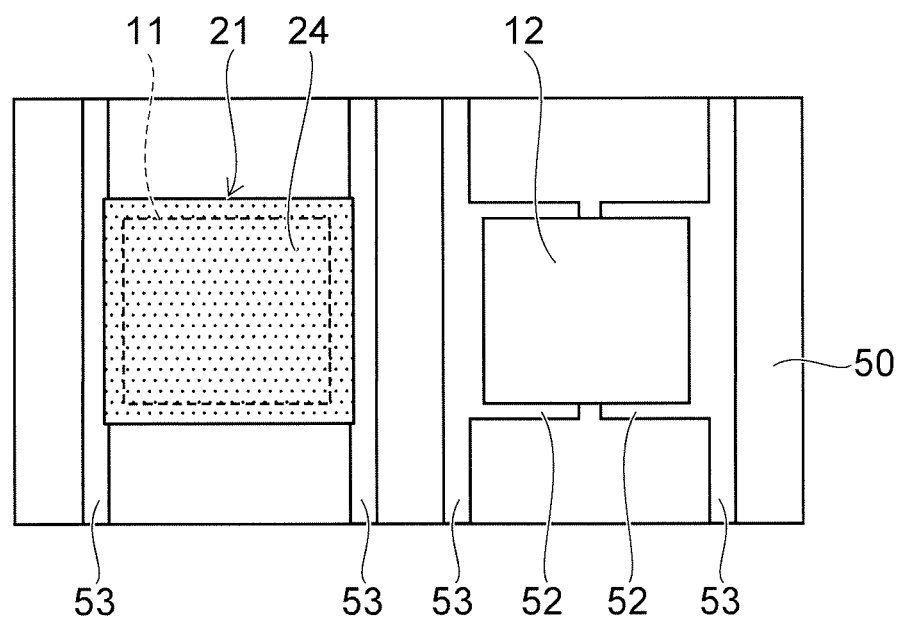
FIG. 2B is a schematic plan view of the light-emitting device of the first embodiment of the invention.

FIG. 2B is a schematic plan view of the light-emitting device of the first embodiment.

The first light-emitting element 11 and the second light-emitting element 12 are placed on a interconnection substrate 50. Interconnection 53 and pads 52 are formed on the upper surface of the interconnection substrate 50. The interconnection 53 and the pads 52 are formed as an integral metal pattern.

For example, the first light-emitting element 11 has a major light-emitting surface at the upper surface and includes external electrodes 31 on the surface on the side opposite to the major light-emitting surface. For example, the second light-emitting element 12 has a major light-emitting surface on the upper surface and includes external electrodes 32 on the surface on the side opposite to the major light-emitting surface. The external electrodes 31 of the first light-emitting element 11 and the external electrodes 32 of the second light-emitting element 12 are bonded to the pads 52 formed on the interconnection substrate 50. Or, the pads 52 may be connected by wires to external electrodes provided on the upper surface sides of the first light-emitting element 11 and the second light-emitting element 12.

The fluorescent layer 21 includes fluorescent particles, and glass 24 in which the fluorescent particles are dispersed. The fluorescent layer 21 is bonded to the upper surface of the first light-emitting element 11. For example, the fluorescent layer 21 is directly bonded to the upper surface of the first light-emitting element 11 at room temperature without interposing a bonding agent including an organic component.

A fluorescent layer is not provided on the second light-emitting element 12; and the second light-emitting element 12 is disposed in a region not including a fluorescent layer.

A portion of the ultraviolet light emitted by the first light-emitting element 11 is absorbed by the fluorescent particles of the fluorescent layer 21 and excites the fluorescent particles. The excited fluorescent particles emit ultraviolet light of a wavelength longer than the ultraviolet light emitted by the first light-emitting element 11. In other words, the ultraviolet light of the first light-emitting element 11 passing through the fluorescent layer 21 and the ultraviolet light undergoing wavelength conversion by the fluorescent particles are emitted from the region where the first light-emitting element 11 is disposed. The ultraviolet light that is emitted by the second light-emitting element 12 is emitted from the region where the second light-emitting element 12 is disposed.

According to such a first light-emitting device of the embodiment, ultraviolet light having a broad light emission spectrum covering a wider range of the ultraviolet light wavelength region can be emitted. Also, downsizing is possible because a discharge tube is not used.

For example, the light-emitting device of the embodiment is applicable to exposing a resist film, curing a resin, drying a coating, etc. For example, according to the type of resist, the resist may be photosensitive not only to some designated wavelength but also to wavelengths at the vicinity of the designated wavelength. By applying the ultraviolet light having the broad light emission spectrum emitted by the light-emitting device of the embodiment to such a resist, an efficient exposure reaction of the resist is possible.

The fluorescent particles are dispersed in the glass 24; and the fluorescent layer 21 does not include a resin. The fluorescent particles are covered with the glass 24, are not exposed, and have high moisture resistance. The fluorescent layer 21 is directly bonded to the upper surface of the first light-emitting element 11. The insulating base material of the interconnection substrate 50 is, for example, a ceramic. Accordingly, glass and/or a ceramic that has lightfastness to ultraviolet light superior to that of a resin is used in the region where the ultraviolet light may be irradiated; and the reliability can be high. For example, when aluminum oxide is used as the ceramic insulating base material, the surface of the interconnection substrate 50 can function as a good reflective surface for the ultraviolet light.

Second Embodiment

Figure 3A:
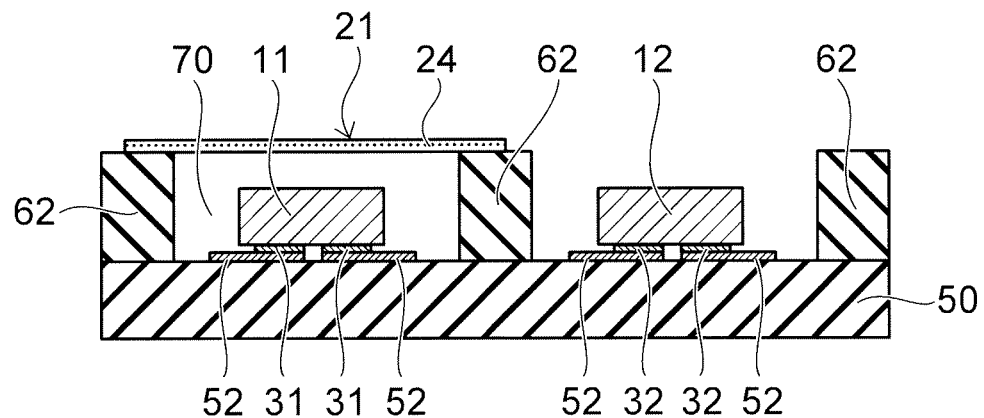
FIG. 3A is a schematic end view of a light-emitting device of a second embodiment of the invention.

FIG. 3A is a schematic end view of a light-emitting device of a second embodiment.

Figure 3B:
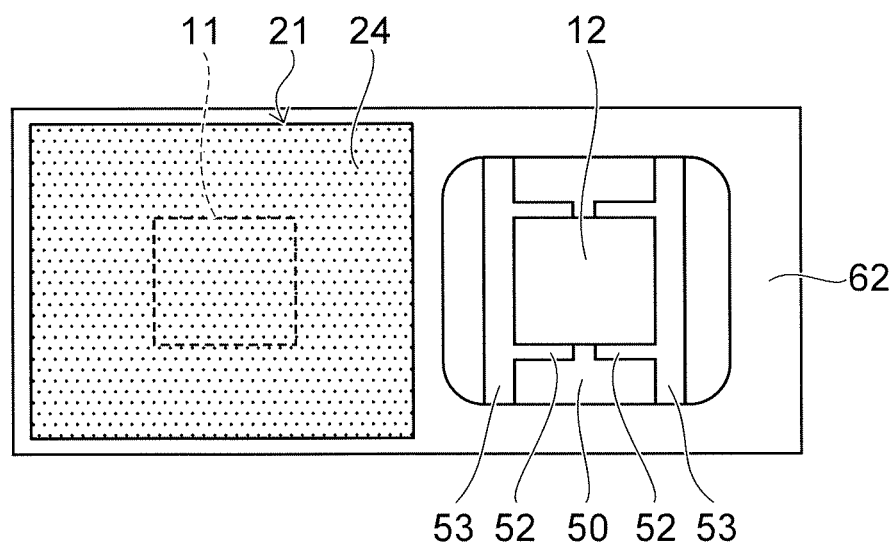
FIG. 3B is a schematic plan view of the light-emitting device of the second embodiment of the invention.

FIG. 3B is a schematic plan view of the light-emitting device of the second embodiment.

Similarly to the first embodiment, the first light-emitting element 11 and the second light-emitting element 12 are placed on the interconnection substrate 50.

A wall portion 62 is provided on the interconnection substrate 50 at the periphery of the first light-emitting element 11 and the periphery of the second light-emitting element 12. For example, the wall portion 62 is made of a metal or a ceramic. The wall portion 62 continuously surrounds the periphery of the first light-emitting element 11 and the periphery of the second light-emitting element 12.

The fluorescent layer 21 is bonded to the upper surface of the wall portion 62 provided at the periphery of the first light-emitting element 11. The fluorescent layer 21 includes fluorescent particles, and the glass 24 in which the fluorescent particles are dispersed. For example, the fluorescent layer 21 is directly bonded to the upper surface of the wall portion 62 at room temperature without interposing a bonding agent including an organic component.

The first light-emitting element 11 is disposed inside a space 70 surrounded with the wall portion 62 and the fluorescent layer 21. The upper surface of the first light-emitting element 11 opposes the fluorescent layer 21 with the space 70 interposed.

A fluorescent layer is not provided on the second light-emitting element 12; and the second light-emitting element 12 is disposed in a region not including a fluorescent layer. The region above the second light-emitting element 12 is open.

Similarly to the first embodiment, in the light-emitting device of the second embodiment as well, ultraviolet light having a broad light emission spectrum covering a wider range of the ultraviolet light wavelength region can be emitted. Also, downsizing is possible because a discharge tube is not used.

The fluorescent particles are dispersed in the glass 24; and the fluorescent layer 21 does not include a resin. The fluorescent particles are covered with the glass 24, are not exposed, and have high moisture resistance. The fluorescent layer 21 is directly bonded to the upper surface of the wall portion 62. The wall portion 62 is made of a metal or a ceramic; and the insulating base material of the interconnection substrate 50 is, for example, a ceramic. Accordingly, glass, a metal, and/or a ceramic that has lightfastness to ultraviolet light superior to that of a resin is used in the region where the ultraviolet light may be irradiated; and the reliability can be high. For example, when aluminum oxide is used as the ceramic, the surface of the interconnection substrate 50 and the side surface of the wall portion 62 can function as good reflective surfaces for the ultraviolet light.

Third Embodiment

Figure 4A:
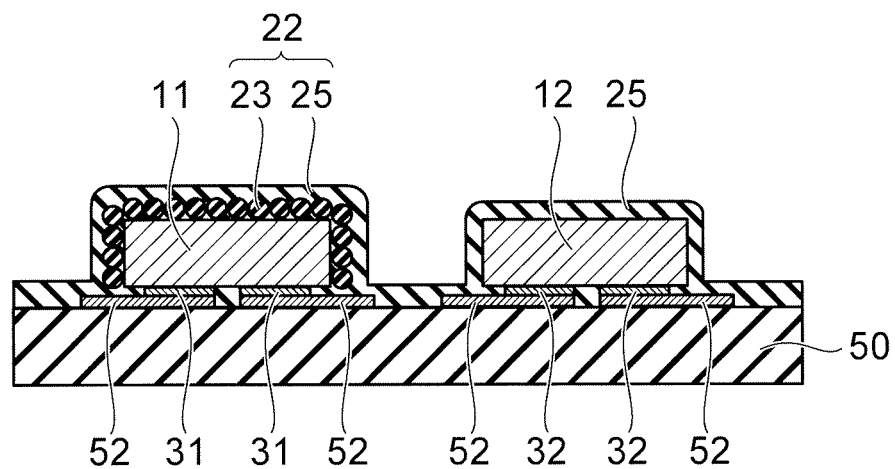
FIG. 4A is a schematic end view of a light-emitting device of a third embodiment of the invention.

FIG. 4A is a schematic end view of a light-emitting device of a third embodiment.

Figure 4B:
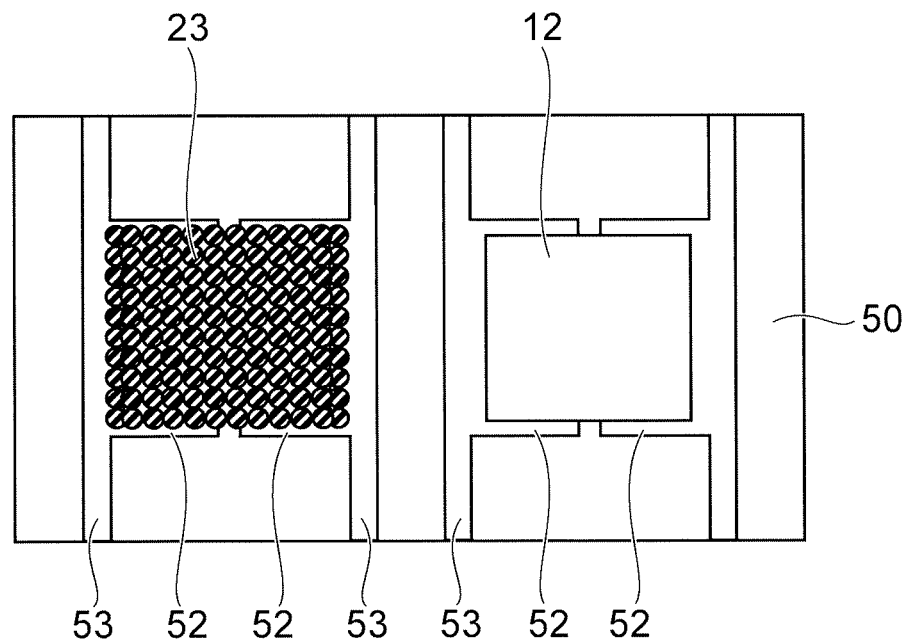
FIG. 4B is a schematic plan view of the light-emitting device of the third embodiment of the invention.

FIG. 4B is a schematic plan view of the light-emitting device of the third embodiment. FIG. 4B is a schematic plan view of the components of FIG. 4A other than a cover film 25.

Similarly to the embodiments recited above, the first light-emitting element 11 and the second light-emitting element 12 are placed on the interconnection substrate 50.

Fluorescent particles 23 are disposed at the upper surface and the side surface of the first light-emitting element 11. For example, the fluorescent particles 23 are deposited and adhered to the upper surface and the side surface of the first light-emitting element 11 by electrodeposition utilizing electrophoresis.

The cover film 25 is provided to cover the first light-emitting element 11, the second light-emitting element 12, and the surface of the interconnection substrate 50. For example, the cover film 25 is formed conformally along the surface of the interconnection substrate 50, the side surface and the upper surface of the first light-emitting element 11, and the side surface and the upper surface of the second light-emitting element 12 by ALD (Atomic Layer Deposition).

The cover film 25 is transmissive to the ultraviolet light emitted by the first light-emitting element 11 and the ultraviolet light emitted by the fluorescent particles 23 and is, for example, an aluminum oxide film. The fluorescent particles 23 are covered with the cover film 25 and are prevented from detaching from the upper surface and the side surface of the first light-emitting element 11. The fluorescent particles 23 and the cover film 25 are included in a fluorescent layer 22.

The upper surface and the side surface of the second light-emitting element 12 where fluorescent particles are not disposed also is covered with the cover film 25. A fluorescent layer is not provided on the second light-emitting element 12; and the second light-emitting element 12 is disposed in a region not including a fluorescent layer.

Similarly to the embodiments recited above, in the light-emitting device of the third embodiment as well, ultraviolet light having a broad light emission spectrum covering a wider range of the ultraviolet light wavelength region can be emitted. Also, downsizing is possible because a discharge tube is not used.

The fluorescent layer 22 does not include a resin; the fluorescent particles 23 are covered with the cover film 25 which is, for example, an aluminum oxide film; and the fluorescent particles 23 are not exposed and have high moisture resistance. The insulating base material of the interconnection substrate 50 is, for example, a ceramic. Accordingly, a ceramic that has lightfastness to ultraviolet light superior to that of a resin is used in the region where the ultraviolet light may be irradiated; and the reliability can be high. For example, when aluminum oxide is used as the ceramic, the surface of the interconnection substrate 50 can function as a good reflective surface for the ultraviolet light.

Fourth Embodiment

Figure 5A:
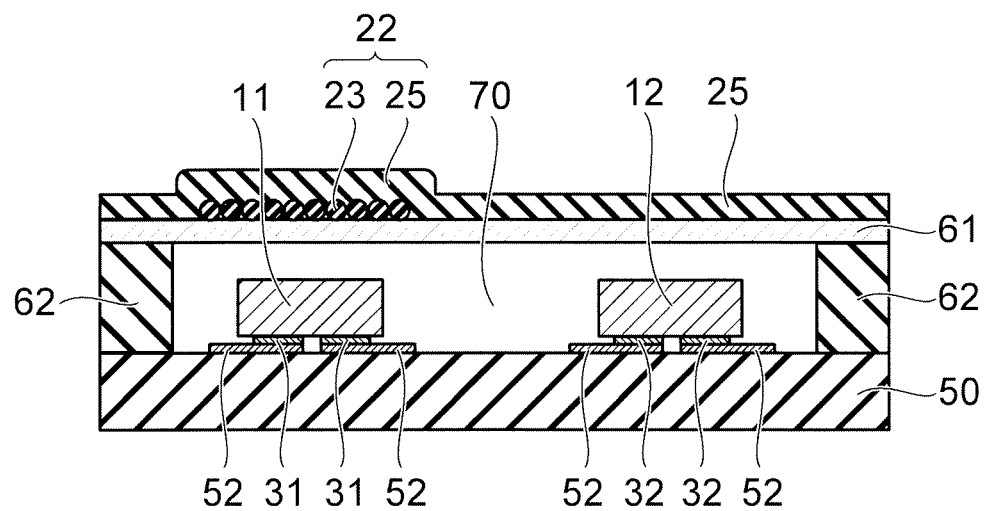
FIG. 5A is a schematic end view of a light-emitting device of a fourth embodiment of the invention.

FIG. 5A is a schematic end view of a light-emitting device of a fourth embodiment.

Figure 5B:
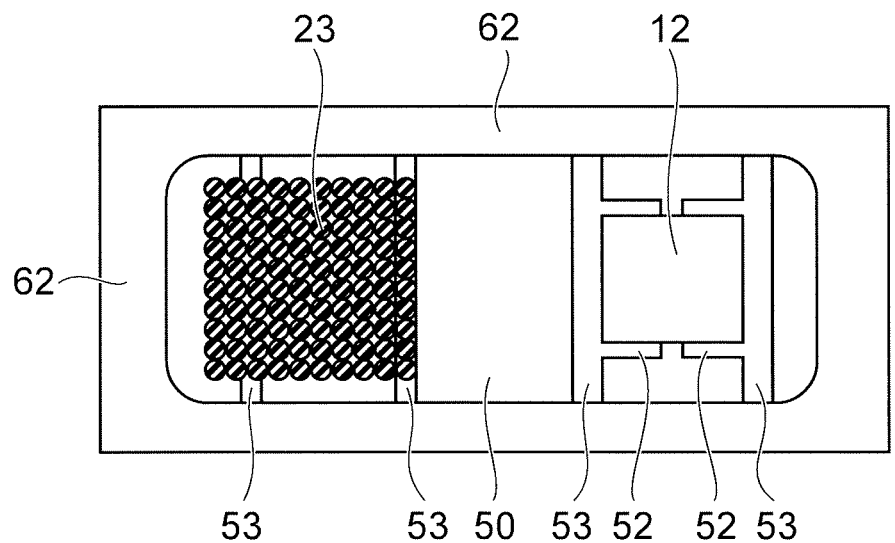
FIG. 5B is a schematic plan view of the light-emitting device of the fourth embodiment of the invention.

FIG. 5B is a schematic plan view of the light-emitting device of the fourth embodiment. FIG. 5B is a schematic plan view of the components of FIG. 5A other than a glass plate 61 and the cover film 25.

Similarly to the embodiment recited above, the first light-emitting element 11 and the second light-emitting element 12 are placed on the interconnection substrate 50.

The wall portion 62 is provided on the interconnection substrate 50 at the periphery of the region where the first light-emitting element 11 and the second light-emitting element 12 are disposed. For example, the wall portion 62 is made of a metal or a ceramic. The wall portion 62 continuously surrounds the periphery of the region where the first light-emitting element 11 and the second light-emitting element 12 are disposed.

The glass plate 61 is bonded to the upper surface of the wall portion 62. For example, the glass plate 61 is directly bonded to the upper surface of the wall portion 62 at room temperature without interposing a bonding agent including an organic component.

The fluorescent particles 23 are disposed on the upper surface of the glass plate 61 in a region opposing the upper surface of the first light-emitting element 11. For example, the fluorescent particles 23 are deposited and adhered to the upper surface of the glass plate 61 by electrodeposition utilizing electrophoresis.

The cover film 25 is provided on the upper surface of the glass plate 61 to cover the fluorescent particles 23. The cover film 25 is transmissive to the ultraviolet light emitted by the first light-emitting element 11 and the ultraviolet light emitted by the fluorescent particles 23 and is, for example, an aluminum oxide film. The fluorescent particles 23 are covered with the cover film 25 and are prevented from detaching from the upper surface of the glass plate 61. The fluorescent particles 23 and the cover film 25 are included in the fluorescent layer 22.

The first light-emitting element 11 and the second light-emitting element 12 are disposed inside the space 70 surrounded with the wall portion 62 and the glass plate 61. The upper surface of the first light-emitting element 11 opposes the fluorescent layer 22 with the space 70 and the glass plate 61 interposed.

A fluorescent layer is not provided on the second light-emitting element 12; and the second light-emitting element 12 is disposed in a region not including a fluorescent layer. The upper surface of the second light-emitting element 12 opposes the glass plate 61 with the space 70 interposed.

Similarly to the embodiment recited above, in the light-emitting device of the fourth embodiment as well, ultraviolet light having a broad light emission spectrum covering a wider range of the ultraviolet light wavelength region can be emitted. Also, downsizing is possible because a discharge tube is not used.

The fluorescent layer 22 does not include a resin; the fluorescent particles 23 are covered with the cover film 25 which is, for example, an aluminum oxide film; and the fluorescent particles 23 are not exposed and have high moisture resistance. The glass plate 61 where the fluorescent layer 22 is provided is directly bonded to the upper surface of the wall portion 62. The wall portion 62 is made of a metal or a ceramic; and the insulating base material of the interconnection substrate 50 is, for example, a ceramic. Accordingly, glass, a metal, and/or a ceramic that has lightfastness to ultraviolet light superior to that of a resin is used in the region where the ultraviolet light may be irradiated; and the reliability can be high. For example, when aluminum oxide is used as the ceramic, the surface of the interconnection substrate 50 and the side surface of the wall portion 62 can function as good reflective surfaces for the ultraviolet light.

Fifth Embodiment

Figure 6A:
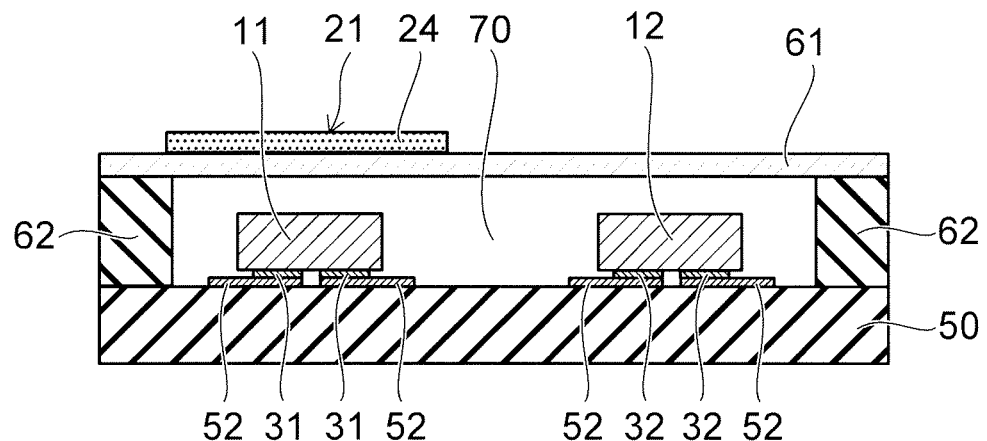
FIG. 6A is a schematic end view of a light-emitting device of a fifth embodiment of the invention.

FIG. 6A is a schematic end view of a light-emitting device of a fifth embodiment.

Figure 6B:
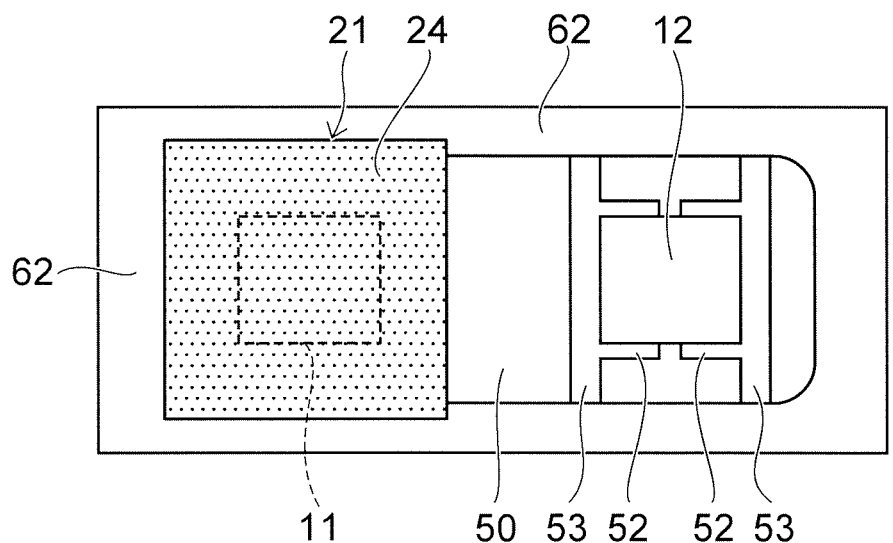
FIG. 6B is a schematic plan view of the light-emitting device of the fifth embodiment of the invention.

FIG. 6B is a schematic plan view of the light-emitting device of the fifth embodiment. FIG. 6B is a schematic plan view of the components of FIG. 6A other than the glass plate 61.

Similarly to the embodiments recited above, the first light-emitting element 11 and the second light-emitting element 12 are placed on the interconnection substrate 50.

The wall portion 62 is provided on the interconnection substrate 50 at the periphery of the region where the first light-emitting element 11 and the second light-emitting element 12 are disposed. For example, the wall portion 62 is made of a metal or a ceramic. The wall portion 62 continuously surrounds the periphery of the region where the first light-emitting element 11 and the second light-emitting element 12 are disposed.

The glass plate 61 is bonded to the upper surface of the wall portion 62. For example, the glass plate 61 is directly bonded to the upper surface of the wall portion 62 at room temperature without interposing a bonding agent including an organic component.

The fluorescent layer 21 is provided on the upper surface of the glass plate 61 in a region opposing the upper surface of the first light-emitting element 11. The fluorescent layer 21 includes fluorescent particles, and the glass 24 in which the fluorescent particles are dispersed. For example, the fluorescent layer 21 is directly bonded to the upper surface of the glass plate 61 at room temperature without interposing a bonding agent including an organic component.

The first light-emitting element 11 and the second light-emitting element 12 are disposed inside the space 70 surrounded with the wall portion 62 and the glass plate 61. The upper surface of the first light-emitting element 11 opposes the fluorescent layer 22 with the space 70 and the glass plate 61 interposed.

A fluorescent layer is not provided on the second light-emitting element 12; and the second light-emitting element 12 is disposed in a region not including a fluorescent layer. The upper surface of the second light-emitting element 12 opposes the glass plate 61 with the space 70 interposed.

Similarly to the embodiments recited above, in the light-emitting device of the fifth embodiment as well, ultraviolet light having a broad light emission spectrum covering a wider range of the ultraviolet light wavelength region can be emitted. Also, downsizing is possible because a discharge tube is not used.

The fluorescent particles are dispersed in the glass 24; and the fluorescent layer 21 does not include a resin. The fluorescent particles are covered with the glass 24, are not exposed, and have high moisture resistance. The glass plate 61 in which the fluorescent layer 21 is provided is directly bonded to the upper surface of the wall portion 62. The wall portion 62 is made of a metal or a ceramic; and the insulating base material of the interconnection substrate 50 is, for example, a ceramic. Accordingly, glass, a metal, and/or a ceramic that has lightfastness to ultraviolet light superior to that of a resin is used in the region where the ultraviolet light may be irradiated; and the reliability can be high. For example, when aluminum oxide is used as the ceramic, the surface of the interconnection substrate 50 and the side surface of the wall portion 62 can function as good reflective surfaces for the ultraviolet light.

The third embodiment shown in FIG. 4A and FIG. 4B and the fourth embodiment shown in FIG. 5A and FIG. 5B are not limited to the fluorescent particles 23 being covered with the cover film 25 after the fluorescent particles 23 are adhered to the first light-emitting element 11; and the fluorescent particles 23 that are pre-covered with the cover film 25 may be adhered to the first light-emitting element 11.

Figure 7:
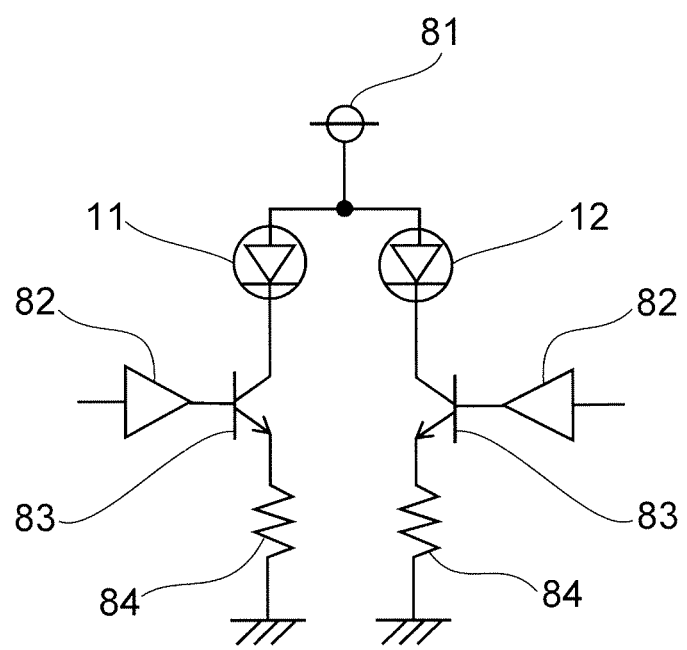
FIG. 7 is a drive circuit diagram of the light-emitting device of the embodiments of the invention.

FIG. 7 is a drive circuit diagram of the light-emitting device of the embodiments described above.

The anode of the first light-emitting element 11 and the anode of the second light-emitting element 12 are connected to a common power supply 81. The cathode of the first light-emitting element 11 is connected to ground via a transistor 83 and a resistor 84. The cathode of the second light-emitting element 12 is connected to ground via the transistor 83 and the resistor 84. The transistor 83 is turned on and off by applying a control signal to the control terminal of the transistor 83 via an amplifier 82.

The first light-emitting element 11 and the second light-emitting element 12 are the same type of light-emitting element having the same light emission wavelength. Such a first light-emitting element 11 and such a second light-emitting element 12 can be driven by the same drive voltage applied from the common power supply 81 and can use identical transistors 83, amplifiers 82, resistors 84, etc.; and the circuit configuration can be simple. It is unnecessary for the first light-emitting element 11 and the second light-emitting element 12 respectively to have power supplies having different voltage values, resistors having different resistance values, amplifiers having different specifications, or transistors having different specifications.

By turning the transistors 83 on and off, only the first light-emitting element 11 disposed under the fluorescent layer 21 (or 22) can be driven; only the second light-emitting element 12 disposed in the region not including the fluorescent layer can be driven; or both the first light-emitting element 11 and the second light-emitting element 12 can be driven; and wavelength switching and intensity switching of the ultraviolet light emitted by the light-emitting device is possible.

Sixth Embodiment

Figure 8A:
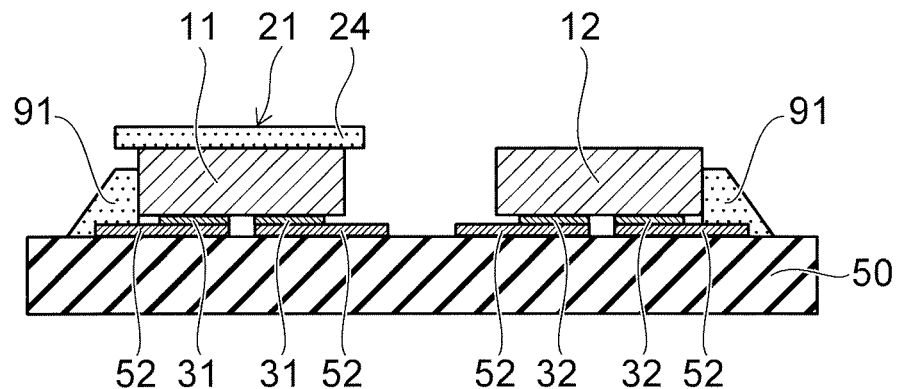
FIG. 8A is a schematic end view of a light-emitting device of a sixth embodiment of the invention.

FIG. 8A is a schematic end view of a light-emitting device of a sixth embodiment.

Figure 8B:
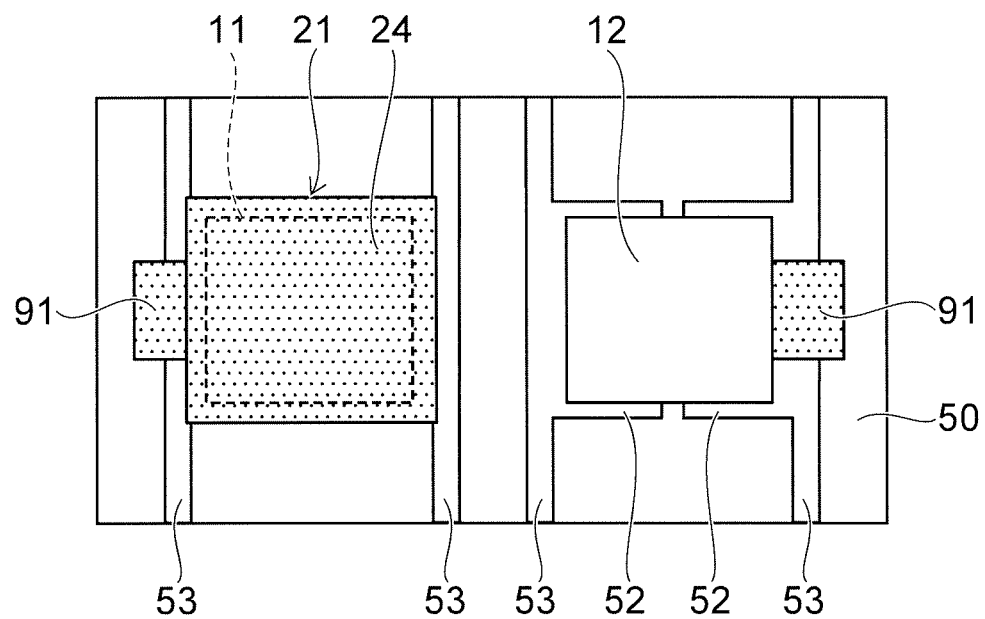
FIG. 8B is a schematic plan view of the light-emitting device of the sixth embodiment of the invention.

FIG. 8B is a schematic plan view of the light-emitting device of the sixth embodiment.

The light-emitting devices of the first to fifth embodiments described above may further include a visible-light fluorescent layer. For example, similarly to the first embodiment, in the example shown in FIGS. 8A and 8B, the first light-emitting element 11 and the second light-emitting element 12 are placed on the interconnection substrate 50; and the fluorescent layer 21 is disposed on the first light-emitting element 11. Also, a visible-light fluorescent layer 91 that includes fluorescent particles excited by the ultraviolet light emitted by the light-emitting elements and emits visible light is disposed at the side surfaces of the first light-emitting element 11 and the second light-emitting element 12.

A portion of the ultraviolet light emitted by the first light-emitting element 11 and the second light-emitting element 12 is absorbed; and visible light is emitted from the visible-light fluorescent layer 91. Therefore, it can be confirmed by the naked eye that the light-emitting device is being driven, that is, ultraviolet light is being emitted. Safer use is possible thereby.

Figure 8C:
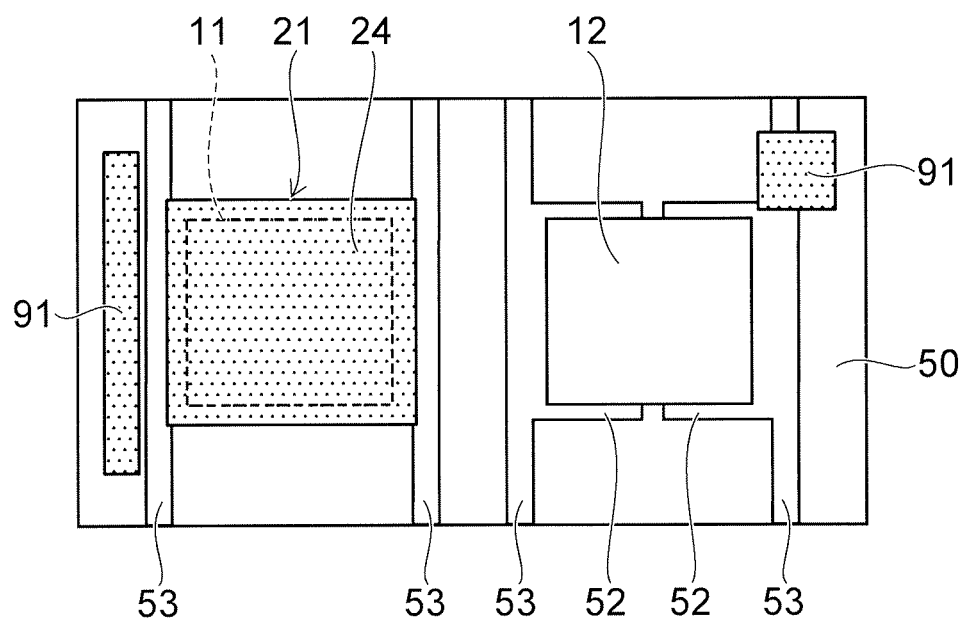
FIG. 8C is a schematic plan view of the light-emitting device of the sixth embodiment of the invention.

The arrangement of the visible-light fluorescent layer 91 is not limited to the position recited above; and it is sufficient for the ultraviolet light of a light-emitting element to be irradiated on the position. For example, as shown in FIG. 8C, it is also possible to dispose the visible-light fluorescent layer 91 at positions not contacting the side surfaces of the light-emitting elements 11 and 12, that is, separated from the light-emitting elements. It is also possible to similarly dispose a visible-light fluorescent in the second to fifth embodiments.

Certain examples of the present invention have been described above. However, the present invention is not limited to these examples. Based on the above-described embodiments of the present invention, all embodiments within the spirit of the present invention that may be implemented by one skilled in the art are also within the scope of the present invention. Additionally, one skilled in the art may conceive of various modifications that also fall within the scope of the present invention.

What is claimed is:

1. A light-emitting device, comprising:
a light-emitting element which emits ultraviolet light; and
a fluorescent layer provided on the light-emitting element,
wherein
the fluorescent layer includes fluorescent particles, the fluorescent particles are excited by the ultraviolet light emitted by the light-emitting element and the excited fluorescent particles emit ultraviolet light of a wavelength longer than the ultraviolet light emitted by the light-emitting element.

2. The device according to claim 1, wherein the fluorescent particles include particles formed from at least one of $YPO_4$:Ce, $Y_2O_3$:Gd, or $YF_3$:Gd, Pr.

3. The device according to claim 1, wherein
the fluorescent layer includes the fluorescent particles and glass, and
the fluorescent particles are dispersed in the glass.

4. The device according to claim 3, wherein the fluorescent layer is directly bonded to the light-emitting element.

5. The device according to claim 3, further comprising a wall portion provided at a periphery of the light-emitting element and made of a metal or a ceramic, wherein
the fluorescent layer is bonded to an upper surface of the wall portion, and
the light-emitting element is disposed inside a space surrounded with the wall portion and the fluorescent layer.

6. The device according to claim 3, further comprising:
a wall portion provided at a periphery of the light-emitting element and made of a metal or a ceramic; and
a glass plate bonded to an upper surface of the wall portion,
wherein
the fluorescent layer is bonded to an upper surface of the glass plate, and
the light-emitting element is disposed inside a space surrounded with the wall portion and the glass plate.

7. The device according to claim 1, wherein
the fluorescent layer includes:
the fluorescent particles adhered to a surface of the light-emitting element; and
a cover film covering the fluorescent particles.

8. The device according to claim 1, further comprising:
a wall portion provided at a periphery of the light-emitting element and made of a metal or a ceramic; and
a glass plate bonded to an upper surface of the wall portion,
wherein
the fluorescent layer includes
fluorescent particles adhered to an upper surface of the glass plate, and
a cover film covering the fluorescent particles, and
the light-emitting element is disposed inside a space surrounded with the wall portion and the glass plate.

9. The device according to claim 7, wherein the cover film is an aluminum oxide film.

10. The device according to claim 1, wherein
a plurality of light-emitting elements is provided, and
the plurality of light-emitting elements includes:
a first light-emitting element provided under the fluorescent layer; and
a second light-emitting element provided in a region not including the fluorescent layer.

11. The device according to claim 10, wherein a drive voltage of the first light-emitting element and a drive voltage of the second light-emitting element are the same.

12. The device according to claim 1, further comprising a visible-light fluorescent layer in at least one of a side surface or a periphery of the light-emitting element,
wherein the visible-light fluorescent layer includes fluorescent particles, the fluorescent particles of the visible-light fluorescent layer are excited by the ultraviolet light emitted by the light-emitting element and the excited fluorescent particles of the visible-light fluorescent layer emit visible light.

13. The device according to claim 1, wherein the light-emitting element emits deep ultraviolet light.

14. The device according to claim 1, wherein the light-emitting element emits ultraviolet light having peak wavelengths in a range not less than 245 nm and not more than 305 nm.

* * * * *